United States Patent [19]

Nash et al.

[11] 3,814,918

[45] June 4, 1974

[54] DIGITAL FILTER FOR A DIGITAL DEMODULATION RECEIVER

[75] Inventors: Harold Garth Nash, Tempe; Michael Frederick Wiles, Phoenix, both of Ariz.

[73] Assignee: Motorola Inc., Chicago, Ill.

[22] Filed: June 28, 1973

[21] Appl. No.: 374,613

[52] U.S. Cl. .................... 235/152, 325/30, 325/320

[51] Int. Cl. .................... H04b 1/16

[58] Field of Search .............. 235/152; 325/30, 320; 328/165, 167

[56] References Cited

UNITED STATES PATENTS

| | | | |
|---|---|---|---|
| 3,656,064 | 4/1972 | Giles | 325/320 X |
| 3,660,771 | 5/1972 | Balugani et al. | 325/320 X |
| 3,674,935 | 7/1972 | Lawrence | 325/320 X |
| 3,719,779 | 3/1973 | Wilson | 325/30 X |

*Primary Examiner*—Malcolm A. Morrison
*Assistant Examiner*—David H. Malzahn
*Attorney, Agent, or Firm*—Vincent J. Rauner; Kenneth R. Stevens

[57] ABSTRACT

A digital filter comprising an up-down counter conditioned by a signal indicative of whether an input periodic oscillation signal is of a frequency representing a binary 1 or a binary 0, to count in one direction to a threshold count for an input 1, and to count in the other direction to a threshold count for an input 0 is disclosed. Additional, a crystal controlled oscillator provides the pulses by which the up-down counter counts in a direction determined by the conditioning signal. The conditioning signal is provided by a storage flip-flop which is conditioned by an indicia signal flip-flop from the digital demodulation receiver.

7 Claims, 2 Drawing Figures

DIGITAL FILTER FOR A DIGITAL DEMODULATION RECEIVER

BACKGROUND OF THE INVENTION

1. Field of the Invention

Digital demodulation receivers are typically frequency-shift keying (FSK) receivers which receive periodic input signals of a first frequency and of a second frequency, providing a binary 1 output in response to the first frequency input and a binary 0 in response to the second frequency input. More particularly, the digital filter of this invention is utilized in an FSK receiver which handles the incoming signals in digital fashion.

2. Prior Art

In the past, the conversion of an input signal of two different frequencies into output binary 1 or 0 (often referred to as "mark" and "space," respectively) is accomplished in largely analog fashion.

For example, in a well known circuit, a pair of selective bandpass filters are each tuned to one of the two input frequencies. A comparison circuit compares the output energy of the filters and if the energy in the 1 bandpass filter is greater than the energy in the 0 bandpass filter, the output is given as a 1. The converse is true for a 0 indication. This circuitry requires high Q's for each filter and that its parameters remain extremely stable under shock, temperature and vibration conditions. Components required are high precision and therefore expensive. Factory adjustments are required to align the filters and periodic maintenance is performed to keep the center frequency of each properly positioned.

Another approach is the zero crossing detector which relates numbers of zero crossings per unit of time to either a 1 or a 0 output. This circuit is not limited to zero volts of course, but is applicable to any reference voltage. A linear filter removes the high frequency components from the detected signal and passes only the 1 - 0 data. The output of the filter, however, does not have sharp data transitions and a limiting amplifier or comparator must be added.

A more recent and popular circuit is the phase locked loop which automatically locks onto the received signal and indicates 1's and 0's by levels in the control voltage. This circuit requires precision components and the accuracy of the center frequencies designed into the system is in the order of 1 to 5 percent. Also, the output does not have sharp data transitions and a limiting amplifier or comparator is required.

A digital frequency-shift keying receiver as described and claimed in copending patent application, Ser. No. 374,594, filed June 28, 1973, assigned to the assignee of this invention, represents a different approach. The digital filter described herein may advantageously be utilized in a digital FSK receiver for reducing bias distortion which is brought about by counting an up-down counter in one direction at a first frequency and in the other direction at a second frequency. In the instant invention, an up-down counter is continuously conditioned by a signal from a storage unit representing a binary 1 or a binary 0 input to the digital FSK receiver while a clock source, independent of the input frequency is used for causing the up-down counter to count in one direction to a threshold count if a 1 input is present, and to count in the other direction to a threshold count if a 0 input signal is present.

BRIEF SUMMARY OF THE INVENTION

A frequency-shift keying (FSK) receiver receives an input, periodic oscillation signal, of a first or a second frequency representing a 1 or a 0, respectively. A threshold detector detects each crossing of a reference potential made by the incoming signal, whether negative or positive going, and provides a pulse for each such crossing. A crystal-controlled oscillator provides accurate clock pulses to a free running counter. The counter starts counting the clock pulses whenever a pulse from the threshold detector is produced. The count is immediately stopped and re-started when another pulse from the threshold detector is produced.

A prescribed count of the counter is translated, with the output of the translator serving as a set input to a flip-flop. If the incoming signal is of a higher frequency, the prescribed count is never reached and the flip-flop never set, indicating a 1 frequency. If the input signal is of a lower frequency, the prescribed count is reached and translated, and the flip-flop set, indicating a 0 input. The prescribed count represents the geometric mean between the two input frequencies.

The flip-flop which may be referred to as an indicia flip-flop, has an output connected to the set input of a second flip-flop. The second flip-flop is set when the indicia flip-flop receives a signal representative of a binary 0 input signal. The output of the second flip-flop is used to condition an up-down counter. When a 1 input is received by the receiver, the second flip-flop is not set and its output conditions the up-down counter to count in a down direction.

The pulses that actually cause the up-down counter to operate are provided by a clock source that is independent from the frequencies of the input signal. A clock frequency higher than the input frequencies must be used and if the clock frequency is made substantially higher, better resolution of the desired output waveform results. Since the clock is asynchronous with the input frequencies, the up count and the down count are equal in time.

An object of this invention is to provide a digital filter for a digital demodulation receiver which effectively eliminates noise.

Another object of this invention is to provide a digital demodulator receiver with a digital filter that is free of bias distortion.

Another object of this invention is to provide a digital demodulation receiver with a digital filter that provides a capability of producing an output waveform of high resolution.

These and other objects will be made evident in the detailed description that follows.

DETAILED DESCRIPTION

Figure 1:
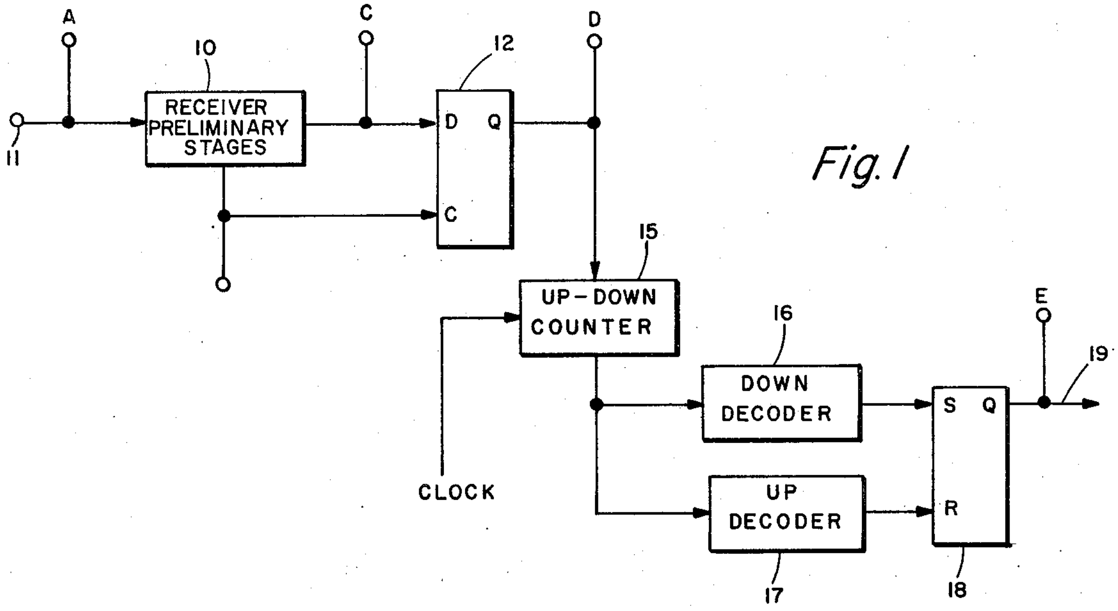
FIG. 1 is a block diagram illustrating components of the invention.

A threshold detector, counter, decoder and indicia flip-flop, preliminary stages of a digital demodulation receiver are shown as block 10. The details of block 10 may be seen in the aforementioned copending application, Ser. No. 374,594, filed June 28, 1973, and assigned to the assignee of this invention.

The output of block 10 is shown as a D input to flip-flop 12. An output from an intermediary section of block 10 is shown as a C input to flip-flop 12. The Q output of flip-flop 12 serves as a conditioning input to up-down counter 15. A clock input is shown to the up-down counter 15. The clock can be a separate clock or can share a clock that is used in connection with the counter of block 10. In either event, the clock is asynchronous with the input frequencies and is selected to provide better resolution of the desired output waveform. The threshold count for up-down counter 15 in the preferred embodiment is 31 with the clock frequency chosen to permit reaching the threshold half way through the bit period, resulting in a resolution of 1.6 percent. The threshold and frequency selected are, of course, arbitrary, and other values can be used for particular applications.

Up-down counter 15 is shown having an output to down decoder 16 and to up decoder 17 with the output of down decoder 16 serving as a set input to flip-flop 18 and the output of up decoder 17 serving as a reset input to flip-flop 18. Flip-flop 18 provides the circuit output 19.

OPERATION

Figure 2:
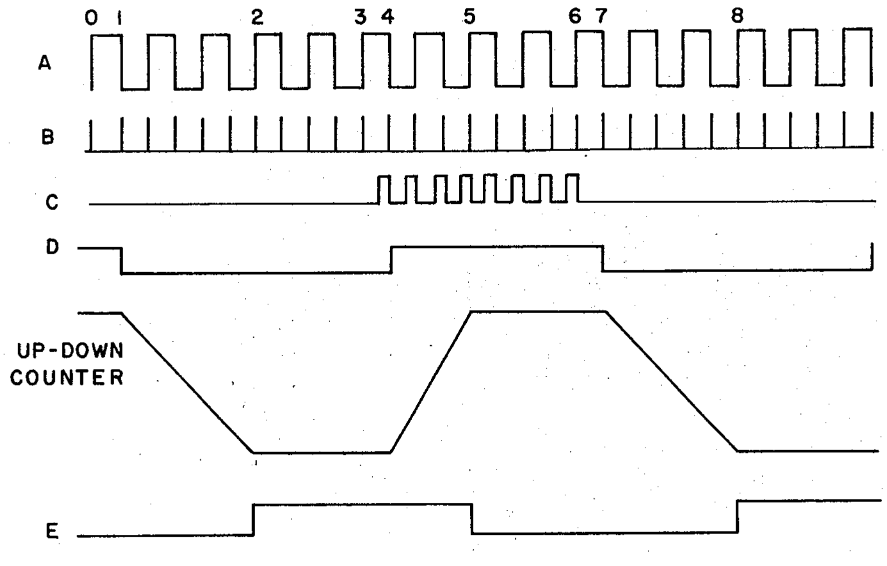
FIG. 2 illustrates idealized signals taken at various points on FIG. 1.

Referring to both FIGS. 1 and 2, the input periodic oscillation signal is shown as signal A in FIG. 2. Signal A has been shaped and limited by stages not shown but also could be a sine wave having a plurality of cycles at one frequency representative of a binary 1 and having a plurality of cycles of another frequency representative of a binary 0. In the same manner, signal A is shown having a first frequency between times 0 and 3, representing a binary 1, and also referred to as "mark" frequency. Then from time 3 through time 6 a second, lower frequency is shown representing a binary 0, which is also referred to as "space" frequency. In the preferred embodiment, the 1 frequency is 1,270 Hz and the 0 frequency is 1,070 Hz.

The plurality of cycles representing a 1 and representing a 0 is dictated by data or bit rates previously established in the industry, together with the frequency ($f_m$) representing the binary 1 and the frequency ($f_s$) representing the 0 frequency. A typical bit rate is in the order of 300 bits per second, which is not intended to be accurately represented by signal A, signal A being merely illustrative.

Signal A is differentiated and rectified in the threshold detector of block 10 producing a unidirectional pulse at each crossing of a reference voltage, as indicated by signal B. The unidirectional pulse for purposes of this specification is defined as brief voltage or current excursion in one direction from a reference level.

Signal C represents the output of the indicia flip-flop of block 10, and the unidirectional pulses thereof appear only when input signal A is of the 0 frequency, as indicated with the first pulse starting just before time 4 and the last pulse ending at time 6.

In this preferred embodiment, $f_m$ equals 1,270 Hz and $f_s$ equals 1,070 Hz with corresponding half cycle periods equal, respectively, to 393.5 microseconds and 467.5 microseconds (rounded off to the nearest 0.5 microsecond). The geometric mean is the selected point of discrimination and is the square root of the product of 393.5 microseconds and 467.5 microseconds, which equals 429 microseconds. 429 microseconds is used as a threshold setting in the counter 13, which in binary notation equals 110101101. Those binary positions which contain 1's when the number is reached are monitored by the decoder of block 10 which sends out a set signal to the indicia flip-flop when all of those bits are 1. When the incoming signal is a 1, however, the counter will never get to a count of 429 because the half cycle period is only 393.5. The counter, in the preferred embodiment, counts 1 every microsecond and therefore when the counter reaches a count of 393, another pulse B from the threshold converter re-starts the counter without it ever having reached a count of 429 and therefore without ever having set the indicia flip-flop. In the case of a 0 input, the counter reaches 429, resulting in the setting of the indicia flip-flop. The counter continues to count up to 467 at which time a pulse B from the threshold detector re-starts the counter and resets the indicia flip-flop.

The indicia flip-flop is not set and the output is a 0, shown in signal C from time 0 through time 3, resulting in flip-flop 12 being cleared at time 1. Flip-flop 12 is of a type wherein the D input conditions the flip-flop to change to the 1 state if the input to D is a 1 when a unidirectional pulse is received at the C input to the flip-flop. Similarly, when the D input is a 0, the flip-flop will assume a 0 state when a unidirectional pulse is received at the C input to the flip-flop. Therefore, at time 1, with signal C a 0, serving as the conditioning input D to flip-flop 12, and with D signal serving as the C input, flip-flop 12 is cleared as shown as signal D. Shortly before time 4, signal C from the indicia flip-flop goes to a 1 so that at time 4 when a B pulse enters the C input of flip-flop 12, flip-flop 12 is set to a 1 and remains set until the C signal again goes to 0.

With D = 0 and the Q output of flip-flop therefore providing a down count signal to counter 15, counter 15 begins counting down at the frequency of the clock input to up-down counter 15. Since the threshold count is set at 31, the up-down counter waveform shown in FIG. 2 is shown as a smooth downward line, without 31 discrete steps, starting at time 1 when D goes to zero and concluding when the counter goes to 0, remaining there until time 4 when D goes to 1, thereby providing up-down counter 15 with a command to count up. The count up proceeds for 31 counts until time 5 when the threshold count of 31 is reached. The counter state remains at 31 until signal D again goes to zero at time 7 when the counter begins counting down again, concluding at time 8 when the count equals the zero threshold.

The down decoder 16 decodes a zero content of the up-down counter 15 and when a zero content is decoded, output flip-flop 18 becomes set. When up decoder 17 decodes a 31 count, flip-flop 18 is reset. The output of flip-flop 18 comes from its Q terminal on line 19 and is shown as signal E, being a 1 from time 2 to time 5 and a 0 from time 5 to time 8.

We claim:

1. In a digital demodulation receiver for receiving an input periodic oscillation signal of a first frequency, designated a binary 1, and of a second frequency, designated a binary 0, and for providing indicia signals representative of whether the signals are of the 1 or 0 frequency, a digital filter comprising:

a. clock pulse means for producing pulses at a prescribed frequency;

b. storage means, receiving the indicia signals, for providing a first output signal substantially continuously in the presence of 1 input signal, and a second output signal substantially continuously in the presence of a 0 input signal; and c. up-down counting means connected to the clock pulse means and to the storage means, for receiving pulses from the clock pulse means as conditioned by the first output signal from the storage means to count in one direction to a first threshold count, and as conditioned by the second storage means to count in the other direction to a second threshold count.

2. The digital filter of claim 1 wherein the clock pulse means further comprise a crystal controlled oscillator.

3. The digital filter of claim 2 wherein the prescribed frequency is higher than the first or second frequency.

4. The digital filter of claim 2 wherein the storage means further comprise a flip-flop, set by an indicia signal representative of a 0 input signal and reset by an indicia signal representative of a 1 input.

5. The digital filter of claim 4 wherein the prescribed frequency is higher than the first or second frequency.

6. The digital filter of claim 1 wherein the storage means further comprise a flip-flop, set by an indicia signal representative of a 0 input signal and reset by an indicia signal representative of a 1 input.

7. The digital filter of claim 6 wherein the prescribed frequency is higher than the first or second frequency.

* * * * *